US010044645B2

(12) United States Patent
Banavalikar (10) Patent No.: US 10,044,645 B2
(45) Date of Patent: *Aug. 7, 2018

(54) TRANSMITTING MULTI-DESTINATION PACKETS IN OVERLAY NETWORKS (71) Applicant: International Business Machines Corporation, Armonk, NY (US)

(72) Inventor: Bhalachandra G. Banavalikar, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/670,425

(22) Filed: Aug. 7, 2017

(65) Prior Publication Data

US 2017/0359276 A1 Dec. 14, 2017

Related U.S. Application Data

(63) Continuation of application No. 14/644,258, filed on Mar. 11, 2015, now Pat. No. 9,887,939.

(51) Int. Cl.
*H04L 12/931* (2013.01)
*H04L 12/935* (2013.01)
*H04L 12/761* (2013.01)

(52) U.S. Cl.
CPC ............ *H04L 49/70* (2013.01); *H04L 49/201* (2013.01); *H04L 49/3009* (2013.01); *H04L 45/16* (2013.01)

(58) Field of Classification Search
CPC ... H04L 49/70; H04L 49/3009; H04L 49/201; H04L 45/16
See application file for complete search history.

(56) References Cited

U.S. PATENT DOCUMENTS 7,219,157 B2 5/2007 Blott et al.
8,510,551 B1 * 8/2013 Desai ..................... H04L 12/18
709/224

(Continued)

FOREIGN PATENT DOCUMENTS

CN 105978817 A 9/2016
DE 102016104264 A1 9/2016

OTHER PUBLICATIONS

IBM, Appendix P, List of IBM Patents or Patent Applications Treated as Related, dated Aug. 8, 2017, 2 pages.

(Continued)

*Primary Examiner* — Edan Orgad
*Assistant Examiner* — Ivan O Latorre
(74) *Attorney, Agent, or Firm* — William H. Hartwell (57) ABSTRACT

In an embodiment, a network adapter receives a request from a first virtual switch of an overlay network to transmit a multi-destination packet to each of one or more virtual switches of the overlay network identified in a list stored in the network adapter. For each of the one or more virtual switches identified in the list, the network adapter creates a head-end replication of the multi-destination packet, obtains tunneling endpoint information for the identified virtual switch, encapsulates the created head-end replication of the multi-destination packet with a header specific to a tunneling protocol identified in the obtained tunneling endpoint information, and transmits the encapsulated packet to a receiver hosted on the identified virtual switch.

20 Claims, 5 Drawing Sheets

(56) References Cited

U.S. PATENT DOCUMENTS

| | | | |
|---|---|---|---|
| 8,635,632 B2 | 1/2014 | Sharma et al. | |
| 8,671,152 B2 | 3/2014 | Horie et al. | |
| 9,654,385 B2 | 5/2017 | Chu et al. | |
| 9,692,698 B2 | 6/2017 | Cherian et al. | |
| 9,871,721 B2* | 1/2018 | Lin | H04L 45/16 |
| 2006/0187950 A1* | 8/2006 | Bou-Diab | H04L 12/185 370/432 |
| 2010/0091648 A1* | 4/2010 | Zhao | H04L 12/1877 370/225 |
| 2010/0238921 A1 | 9/2010 | Karino et al. | |
| 2011/0185082 A1 | 7/2011 | Thompson | |
| 2012/0250682 A1 | 10/2012 | Vincent et al. | |
| 2013/0242991 A1* | 9/2013 | Basso | H04L 45/16 370/390 |
| 2013/0250951 A1 | 9/2013 | Koganti | |
| 2013/0322443 A1 | 12/2013 | Dunbar et al. | |
| 2013/0329605 A1* | 12/2013 | Nakil | H04L 41/0668 370/255 |
| 2013/0332602 A1 | 12/2013 | Nakil et al. | |
| 2014/0003427 A1 | 1/2014 | Nishi et al. | |
| 2014/0059537 A1 | 2/2014 | Kamble et al. | |
| 2014/0071988 A1* | 3/2014 | Li | G06F 3/0484 370/390 |
| 2014/0098815 A1 | 4/2014 | Mishra et al. | |
| 2014/0211793 A1 | 7/2014 | Mital et al. | |
| 2014/0344439 A1 | 11/2014 | Kempf et al. | |
| 2014/0369251 A1* | 12/2014 | Zhang | H04W 4/08 370/312 |
| 2015/0055651 A1 | 2/2015 | Shen et al. | |
| 2015/0063194 A1 | 3/2015 | Yang | |
| 2015/0156108 A1 | 6/2015 | Shi | |
| 2015/0195137 A1 | 7/2015 | Kashyap et al. | |
| 2015/0280928 A1 | 10/2015 | Tessmer et al. | |
| 2015/0304117 A1 | 10/2015 | Dong et al. | |
| 2015/0381386 A1 | 12/2015 | Sigoure et al. | |
| 2015/0381484 A1 | 12/2015 | Hira et al. | |
| 2016/0006646 A1 | 1/2016 | Lin et al. | |
| 2016/0021015 A1 | 1/2016 | Thoria et al. | |
| 2016/0127214 A1 | 5/2016 | Tessmer et al. | |
| 2016/0142226 A1 | 5/2016 | Huang et al. | |
| 2016/0269324 A1 | 9/2016 | Banavalikar | |

OTHER PUBLICATIONS

Bharath-Kumar et al.,"Minimum Spanning Tree Approximation for Multi-Destination Routing", IP.com Prior Art Database Technical Disclosure, IP.com No. IPCOM000047508D, IP.com Electronic Publication: Feb. 7, 2005, 4 pages.

Bharath-Kumar et al., "Multi-Destination Routing", Authors et. al.: Disclosed Anonymously, IP.com Prior Art Database Technical Disclosure, IP.com No. IPCOM000049502D, IP.com Electronic Publication: Feb. 9, 2005, 3 pages.

"Method and System for Distributing Coherent Traffic in Cloud Infrastructures", IP.com Prior Art Database Technical Disclosure, IP.com No. IPCOM000236163D, IP.com Electronic Publication: Apr. 10, 2014, 5 pages.

* cited by examiner

TRANSMITTING MULTI-DESTINATION PACKETS IN OVERLAY NETWORKS

BACKGROUND

The present invention relates generally to the field of data transmissions, and more particularly to transmitting multi-destination packets in overlay networks.

A data processing environment comprises a variety of hardware, software, and firmware networking components. A physical network, also called an underlay, is a network defined using such components.

Techniques are available presently to construct a logical network, also known as a software defined network (SDN) overlay (hereinafter "overlay," "overlay network," or "OVN"), from such networking components. Essentially, networking components are abstracted into corresponding logical or virtual representations, and the abstractions are used to define the overlay. In other words, an overlay is a logical network formed and operated using logical representations of underlying networking components.

Physical networks usually exist within the demarcated boundary of the data processing environment whose networking components are utilized in the physical network. Unlike a physical network, an overlay can be designed to span across one or more data processing environment. For example, while a physical network may be contained within a datacenter, an overlay may span across one or more datacenters.

As an example, a logical representation of a networking gateway can participate in an overlay, such that a function attributed to the logical representation of the networking gateway in the overlay is actually performed by the underlying networking gateway component in the underlay.

In an overlay, because the actual networking components that perform the networking functions are abstracted into logical entities representing the networking functionality offered by those components and not the actual implementations of those functionalities, something is needed to direct that networking functionality into a functioning logical network. An SDN controller is a component that manages and operates the logical networking components within an overlay.

A virtual machine (VM) comprises virtualized representations of real hardware, software, and firmware components available in a data processing system. The data processing system can have any number of VMs configured thereon, and utilizing any number of virtualized components therein. The data processing system is also referred to as a computing node, a compute node, a node, or a host.

In large scale data processing environments, such as in a data center, thousands of VMs can be operating on a host at any given time, and hundreds if not thousands of such hosts may be operational in the data center at the time. A virtualized data processing environment such as the described data center is often referred to as a "cloud" that provides computing resources and computing services to several clients on an as-needed basis.

A virtual switch, sometimes herein referred to as a vSwitch, is a software application that allows communication between VMs. A virtual switch is completely virtual and can connect to a network interface card (NIC). A virtual switch merges physical switches into a single logical switch. This helps to increase bandwidth and create an active mesh between servers and switches. A virtual switch may be embedded into a server's installed software or included in a server's hardware as part of its firmware.

Network virtualization by defining overlay networks is an emerging trend in the management and operation of data centers and cloud computing environments. One of the goals of network virtualization is to simplify the network provisioning in multi-tenant data processing environments, as well as dedicated customer data processing environments.

Unicasting is a method of sending data point-to-point, to wit, from a single sender to a single receiver. Broadcasting is a method of sending the same data to all possible destinations. Another multi-destination distribution method, multicasting, sends the same data only to interested destinations called receivers by using special address assignments. Internet Protocol (IP) multicast is the process of multicasting IP packets to several receivers in a single transmission of the IP packet. IP multicast is a popular technique used to help conserve bandwidth in the data center and reduce the load on servers.

IP multicast operating in an overlay network is called overlay multicast. Overlay multicast can be achieved in different ways, depending on the support for multicasting provided in the underlay network. Multicast based overlay multicast requires the underlay network to provide support for multicasting. Multicasting in underlay networks is not presently prevalent in data processing environments. Multi-unicast based overlay multicast is a method to transmit multicast packets in the overlay network where the underlay supports unicasting but does not support multicasting.

SUMMARY

In one embodiment, a method includes a network adapter receiving a request from a first virtual switch of an overlay network to transmit a multi-destination packet to each of one or more virtual switches of the overlay network identified in a list stored in the network adapter. The method further includes, for each of the one or more virtual switches identified in the list: the network adapter creating a head-end replication of the multi-destination packet; the network adapter obtaining tunneling endpoint information for the identified virtual switch; the network adapter encapsulating the created head-end replication of the multi-destination packet with a header specific to a tunneling protocol identified in the obtained tunneling endpoint information; and the network adapter transmitting the encapsulated packet to a receiver hosted on the identified virtual switch.

In another embodiment, a computer program product stores program instructions executable by a processor of a network adapter to implement a method. The method includes the network adapter receiving a request from a first virtual switch of an overlay network to transmit a multi-destination packet to each of one or more virtual switches of the overlay network identified in a list stored in the network adapter. The method further includes, for each of the one or more virtual switches identified in the list: the network adapter creating a head-end replication of the multi-destination packet; the network adapter obtaining tunneling endpoint information for the identified virtual switch; the network adapter encapsulating the created head-end replication of the multi-destination packet with a header specific to a tunneling protocol identified in the obtained tunneling endpoint information; and the network adapter transmitting the encapsulated packet to a receiver hosted on the identified virtual switch.

In another embodiment, a network adapter includes a processor, a memory, and program instructions stored in the memory for execution by the processor to implement a method. The method includes the network adapter receiving a request from a first virtual switch of an overlay network to transmit a multi-destination packet to each of one or more virtual switches of the overlay network identified in a list stored in the network adapter. The method further includes, for each of the one or more virtual switches identified in the list: the network adapter creating a head-end replication of the multi-destination packet; the network adapter obtaining tunneling endpoint information for the identified virtual switch; the network adapter encapsulating the created head-end replication of the multi-destination packet with a header specific to a tunneling protocol identified in the obtained tunneling endpoint information; and the network adapter transmitting the encapsulated packet to a receiver hosted on the identified virtual switch.

DETAILED DESCRIPTION

Embodiments in accordance with the present invention recognize significant advantages of network adapters that maintain maps of multi-destination groups and tunneling endpoints (TEPs), provide application program interfaces (APIs) to manipulate such maps, and handle head-end-replication for multi-destination packets based on offload instructions provided by a software based data path. Embodiments described herein relieve a virtual switch from creating one-to-many unicast packets for multi-destination packets, and performing checksums and encapsulations for each of the newly created packets. Embodiments described herein eliminate the limitations of existing approaches for handling multi-destination packets at a virtual switch software based data path.

Embodiments described herein recognize that multi-destination traffic handling at OVN TEPs is a central processing unit (CPU) expensive operation. Some implementations of multi-destination packet handling at OVN TEPs have dependencies on underlay network support for handling multi-destination packets, which poses significant restrictions on the deployability of such OVN solutions because required underlay network support to handle multi-destination packets is not always present in a customer premises. Customer premises equipment (CPE) is telephone or other service provider equipment that is located on the customer's premises (physical location) rather than on the provider's premises or in between. Telephone handsets, cable TV set-top boxes, and digital subscriber line (DSL) routers are examples of CPE. Alternatively, OVN TEPs use a repetitive unicast approach to handle multi-destination packet delivery. Embodiments described herein recognize that such an approach is CPU intensive, latency prone and has significant scaling issues because packet formation, checksum and encapsulation work is performed in a software-based data path. Embodiments described herein further recognize that such an implementation also suffers from inconsistent multi destination packet handling performance and impacts handling of normal unicast packets because typical handling of repetitive unicast of multi-destination packets involves creating one-to-many unicast packets for each multi-destination packet ahead of other unicast packets destined for remote TEPs. This problem becomes even more severe when an OVN TEP has a single physical connection to an underlay network.

Figure 1:
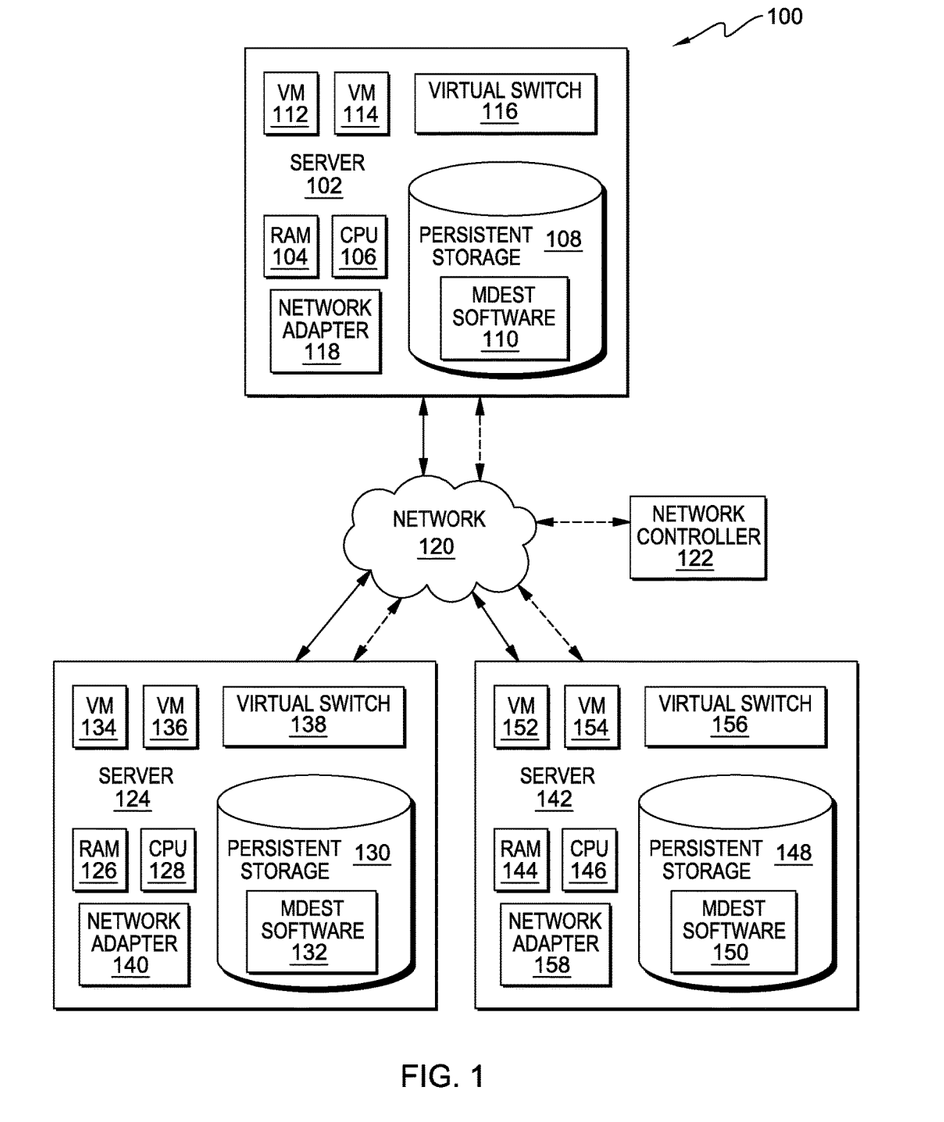
FIG. 1 is a functional block diagram illustrating a multi-destination packet processing environment, in an embodiment in accordance with the present invention.

Embodiments in accordance with the present invention will now be described in detail with reference to the Figures. FIG. 1 is a functional block diagram illustrating a multi-destination packet processing environment, in an embodiment in accordance with the present invention.

Multi-destination packet processing environment 100 includes a server 102, a network controller 122, a server 124, and a server 142, all interconnected over a network 120. Servers 102, 124, and 142 may each be any electronic device or combination of electronic devices capable of processing program instructions and receiving and sending data, for example, over network 120. In some embodiments, servers 102, 124, and 142 may be any of a laptop computer, a tablet computer, a netbook computer, a personal computer (PC), a desktop computer, a server computer, a personal digital assistant (PDA), or smart phone. In other embodiments, servers 102, 124, and 142 may each represent server computing systems utilizing multiple computers as a server system, such as in a distributed computing environment.

Server 102 includes a RAM 104, a CPU 106, a persistent storage 108, a VM 112, a VM 114, a virtual switch 116, and a network adapter 118. Persistent storage 108 may, for example, be a hard disk drive. Alternatively, or in addition to a magnetic hard disk drive, persistent storage 108 may include a solid state hard drive, a semiconductor storage device, read-only memory (ROM), erasable programmable read-only memory (EPROM), flash memory, or any other computer-readable storage medium that is capable of storing program instructions or digital information. Persistent storage 108 stores operating system software, as well as software that enables server 102 to communicate with network controller 122, server 124, and server 142 over a data connection on network 120. Multi-destination software 110 (sometimes abbreviated as "mdest software 110") is also stored in persistent storage 108. Multi-destination software 110 is software that enables virtual switch 116 to communicate with network controller 122, VM 112 and VM 114 on server 102; a VM 134, a VM 136, and a virtual switch 138 on server 124; and a VM 152, a VM 154, and a virtual switch 156 on server 142 over network 120. Multi-destination software 110 also enables network controller 122 to provision virtual switches 116, 138, and 156 with multi-destination group receiver lists for a given multi-destination group.

VM 112 communicates with VM 134 and VM 152 through virtual switch 116, virtual switch 138, and virtual switch 156 using an overlay virtual network on network 120. VM 114 communicates with VM 136 and VM 154 through virtual switch 116, virtual switch 138, and virtual switch 156 using a separate overlay virtual network on network 120. Virtual switch 116 is used by VM 112 and VM 114 to communicate with nodes on their respective overlay network on network 120. In one embodiment, there may be many virtual machines and virtual overlay networks existing in multi-destination packet processing environment 100. In other embodiments, network controller 122 may reside on a server in multi-destination packet processing environment 100, or as a standalone computer connected to network 120.

Network adapter 118 is a computer hardware component that connects server 102 to network 120. Network adapter 118 allows server 102 to communicate with network controller 122, server 124, and server 142. Network adapter 118 also includes offload capabilities which allow network adapter 118 to maintain maps of multi-destination groups and TEPs, provides application program interfaces (APIs) to manipulate such maps, and handles head-end-replication for multi-destination packets based on offload instructions provided by a software based data path. Network adapter 118 also enables VM 112 to communicate with VM 134 and VM 152 through virtual switch 116, virtual switch 138, and virtual switch 156 using an overlay virtual network on network 120. Network adapter 118 also enables VM 114 to communicate with VM 136 and VM 154 through virtual switch 116, virtual switch 138, and virtual switch 156 using a separate overlay virtual network on network 120.

In FIG. 1, network 120 is shown as the interconnecting fabric between server 102, network controller 122, server 124, and server 142. In practice, network 120 may be any viable data transport network. Network 120 can be, for example, a local area network (LAN), a wide area network (WAN) such as the Internet, or a combination of the two, and can include wired, wireless, or fiber optic connections. In general, network 120 can be any combination of connections and protocols that will support communications between server 102, network controller 122, server 124, and server 142 in accordance with an embodiment of the invention.

Network Controller 122 is an SDN controller that has visibility of end to end provisioning of virtual networks, virtual switches, virtual endpoints (multi-destination senders and receivers). Network Controller 122 is responsible for generating, and provisioning, the multi-destination group receivers list within a given multi-destination group, e.g., VM 112, VM 134 and VM 152, to the virtual switch, e.g., virtual switch 156, that has the multi-destination sender for the given multi-destination group. In one embodiment, network controller 122 may be a separate computer system, server, or hardware in multi-destination packet processing environment 100. In another embodiment, network controller 122 may be part of server 102, server 124, or server 142. Some embodiments may include more than one network controller in multi-destination packet processing environment 100 to, for example, serve as a backup to network controller 122.

Server 124 includes a RAM 126, a CPU 128, a persistent storage 130, VM 134, VM 136, virtual switch, and a network adapter 140. Persistent storage 130 contains mdest software 132 analogous to mdest software 110. Network adapter 140 is a computer hardware component that connects server 124 to network 120. Network adapter 140 allows server 124 to communicate with network controller 122, server 102, and server 142. Network adapter 140 also includes offload capabilities which allow network adapter 140 to maintain maps of multi-destination groups and TEPs, provides application program interfaces (APIs) to manipulate such maps, and handles head-end-replication for multi-destination packets based on offload instructions provided by a software based data path. Network adapter 140 also enables VM 134 to communicate with VM 112 and VM 152 through virtual switch 138, virtual switch 116, and virtual switch 156 using an overlay virtual network on network 120. Network adapter 140 also enables VM 136 to communicate with VM 114 and VM 154 through virtual switch 138, virtual switch 116, and virtual switch 156 using a separate overlay virtual network on network 120.

Server 142 includes a RAM 144, a CPU 146, a persistent storage 148, VM 152, VM 154, virtual switch 156, and a network adapter 158. Persistent storage 148 contains mdest software 150 analogous to mdest software 110. Network adapter 158 is a computer hardware component that connects server 142 to network 120. Network adapter 158 allows server 142 to communicate with network controller 122, server 102, and server 124. Network adapter 158 also includes offload capabilities which allow network adapter 158 to maintain maps of multi-destination groups and TEPs, provides application program interfaces (APIs) to manipulate such maps, and handles head-end-replication for multi-destination packets based on offload instructions provided by a software based data path. Network adapter 158 also enables VM 152 to communicate with VM 112 and VM 134 through virtual switch 156, virtual switch 116, and virtual switch 138 using an overlay virtual network on network 120. Network adapter 158 also enables VM 154 to communicate with VM 114 and VM 136 through virtual switch 156, virtual switch 116, and virtual switch 138 using a separate overlay virtual network on network 120.

In example embodiment of FIG. 1, server 142 serves as the multi-destination sender for a multi-destination group referred to as "MDG-1" hosted on virtual switch 156 and handles network data for VM 112, VM 134, VM 152, virtual switch 138, and virtual switch 116. Server 142 also serves as the multi-destination sender for a multi-destination group referred to as "MDG-2" (not shown) hosted on virtual switch 156 and handles network data for VM 114, VM 136, VM 154, virtual switch 138, and virtual switch 116. In other embodiments, multi-destination groups may be hosted on one or more virtual switches in multi-destination packet processing environment 100.

Figure 2:
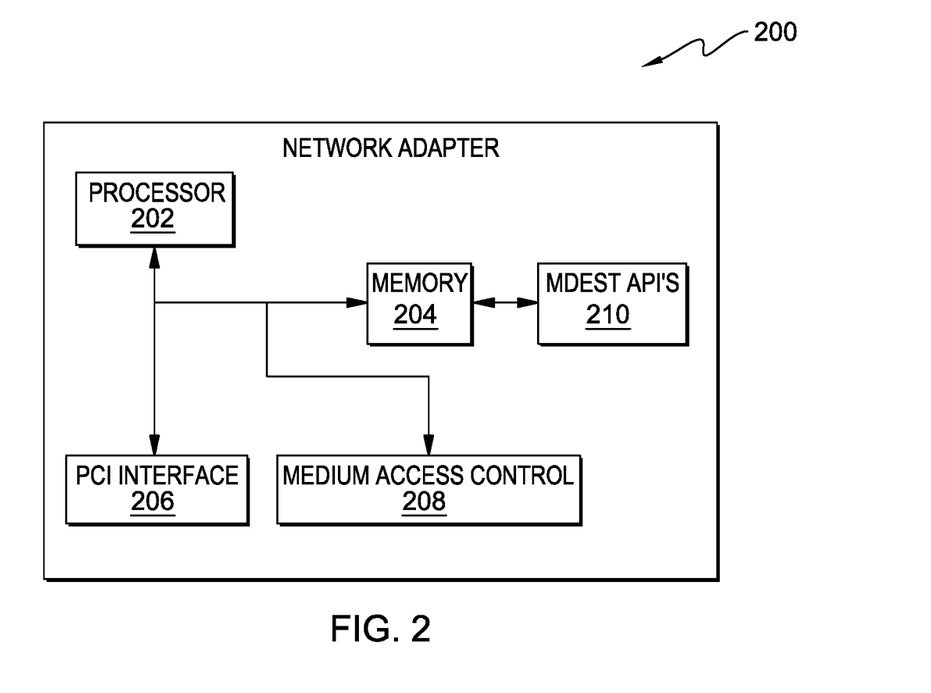
FIG. 2 is a functional block diagram illustrating a network adapter in an embodiment in accordance with the present invention.

FIG. 2 is a functional block diagram illustrating a network adapter in an embodiment in accordance with the present invention. Network adapter 200 is an embodiment of each of network adapters 118, 140, and 158 and contains processor 202, memory 204, peripheral component interconnect (PCI) interface 206, medium access control 208, and multi-destination application program interface (APIs) 210. It should be appreciated that FIG. 2 provides only an illustration of one implementation and does not imply any limitations with regard to the environments in which different embodiments may be implemented. Many modifications to the depicted environment may be made. In one embodiment, multi-destination APIs 210 may reside in memory 204 or in a separate read-only memory (ROM), erasable programmable read-only memory (EPROM), or flash memory. In another embodiment, multi-destination APIs 210 may reside on a host server and may be downloaded to network adapter 118.

Multi-destination APIs 210 enable network adapter 200 to create and store multi-destination group lists based on the multi-destination group receivers list hosted by a multi-destination sender, e.g., virtual switch 156. Offloading multi-destination operations from a virtual switch, e.g., virtual switch 156, to network adapter 200 provides a significant reduction in host CPU utilization for multi-destination packet processing operations. Another advantage of offloading multi-destination operations to network adapter 200 is improved packet send latencies because processing is done at the hardware level. Offloading multi-destination operations to network adapter 200 also solves scalability issues with growing multi-destination group membership lists.

Scalability is an ability of a system, network, or process to handle a growing amount of work in a capable manner or its ability to be enlarged to accommodate that growth. For software-implemented packet replication and head-end replication for each multi-destination group member, when the multi-destination group member list increases, checksum calculations must be performed for each packet being transmitted, putting a high load on the host CPU that grows as the multi-destination group membership list grows. With these operations offloaded to network adapter 200, CPUs, such as CPUs 106, 128, and 146 are able to provide more processing cycles to other tasks.

Figure 3:
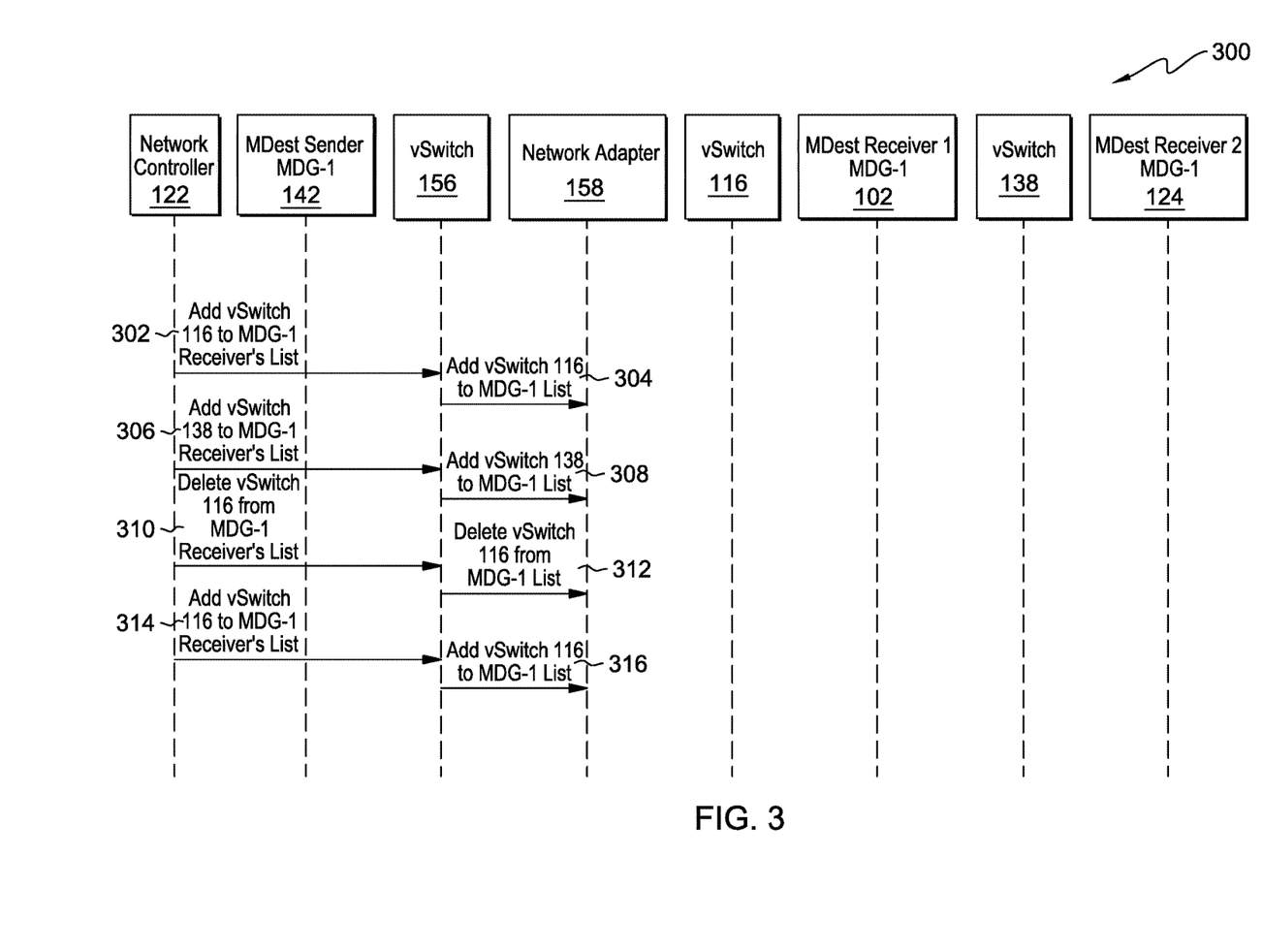
FIG. 3 is a flowchart depicting operational steps of adding and removing virtual switches to a multi-destination group receiver list within the multi-destination packet processing environment of FIG. 1, in an embodiment in accordance with the present invention.

FIG. 3 is a flowchart, generally designated 300, depicting operational steps of adding and removing virtual switches to a multi-destination group receiver list within the multi-destination packet processing environment of FIG. 1, in an embodiment in accordance with the present invention. In this example embodiment, virtual switch 156 on server 142 is the multi-destination sender for MDG-1. Network controller 122 sends a request to virtual switch 156 to add virtual switch 116 to an MDG-1 receiver's list on network adapter 158 as depicted in step 302. The MDG-1 receiver's list may be stored in memory 204 of network adapter 158. In step 304, in response to receiving the request, virtual switch 156 calls one or more of multi-destination APIs 210 of network adapter 158 to update MDG-1 by adding virtual switch 116 to the MDG-1 receiver's list on network adapter 158. In response to receiving the call to the one or more of multi-destination APIs 210 of network adapter 158, network adapter 158 updates MDG-1 by adding virtual switch 116 to the MDG-1 receiver's list on network adapter 158.

Network controller 122 sends a request to virtual switch 156 to add virtual switch 138 to the MDG-1 receiver's list on virtual switch 156 as depicted in step 306. In step 308, in response to receiving the request, virtual switch 156 calls one or more of multi-destination APIs 210 of network adapter 158 to update MDG-1 by adding virtual switch 138 to the MDG-1 receiver's list on network adapter 158. In response to receiving the call to the one or more of multi-destination APIs 210 of network adapter 158, network adapter 158 updates MDG-1 by adding virtual switch 138 to the MDG-1 receiver's list on network adapter 158.

A virtual switch is removed from the multi-destination group in a similar manner. In step 310, network controller 122 sends a request to virtual switch 156 to delete virtual switch 116 from the MDG-1 receiver's list. In step 312, in response to receiving the request, virtual switch 156 calls one or more of multi-destination APIs 210 of network adapter 158 to update MDG-1 by deleting virtual switch 116 from the MDG-1 receiver's list on network adapter 158. In response to receiving the call to the one or more of multi-destination APIs 210 of network adapter 158, network adapter 158 updates MDG-1 by deleting virtual switch 116 from the MDG-1 receiver's list on network adapter 158.

Network controller 122 sends another request to add virtual switch 116 to the MDG-1 receiver's list on network adapter 158 as depicted in step 314. In step 316, in response to receiving the request, virtual switch 156 calls one or more of multi-destination APIs 210 of network adapter 158 to update MDG-1 by adding virtual 116 to the MDG-1 receiver's list on network adapter 158. In response to receiving the call to the one or more of multi-destination APIs 210 of network adapter 158, network adapter 158 updates MDG-1 by adding virtual switch 116 to the MDG-1 receiver's list on network adapter 158. Maintaining multi-destination group lists, such as the MDG-1 receiver's list, in network adapter 158 provides the ability to scale the lists seamlessly within multi-destination packet processing environment 100.

Figure 4:
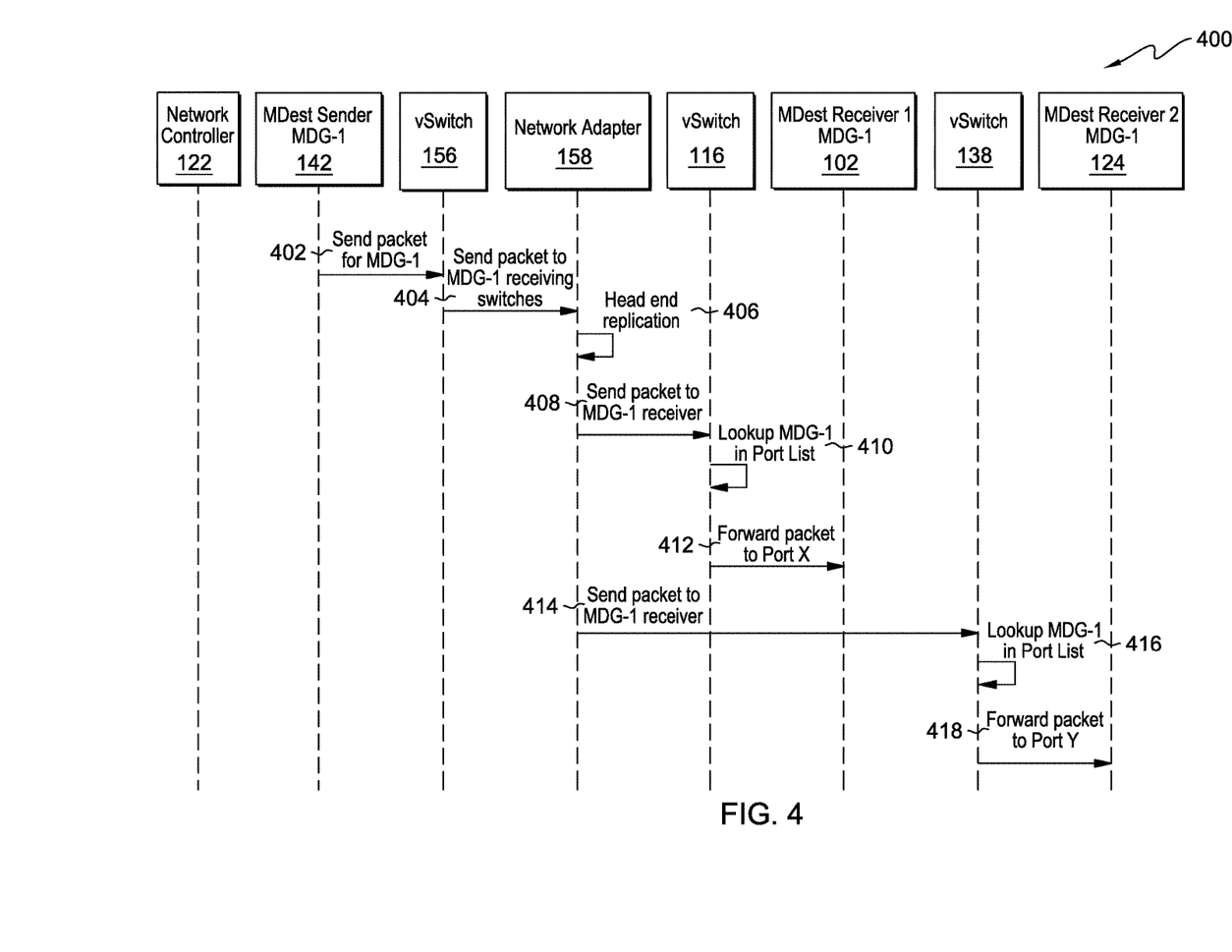
FIG. 4 is a flowchart depicting operational steps for transmitting a multi-destination packet to a multi-destination group within the multi-destination packet processing environment of FIG. 1, in an embodiment in accordance with the present invention.

FIG. 4 is a flowchart, generally designated 400, depicting operational steps for transmitting a multi-destination packet to a multi-destination group within the multi-destination packet processing environment of FIG. 1, in an embodiment in accordance with the present invention. In step 402, server 142 transmits a multi-destination packet for MDG-1 to virtual switch 156. In one embodiment, the multi-destination packet may originate from virtual machine 152 or virtual machine 154. In another embodiment, the multi-destination packet may originate from mdest software 150 stored in persistent storage 148. Virtual switch 156 calls one or more of multi-destination APIs 210 of network adapter 158 for network adapter 158 to transmit the multi-destination packet to the virtual switches in the MDG-1 receiver's list as depicted in step 404. In step 406, in response to receiving the call to the one or more of multi-destination APIs 210 of network adapter 158 for network adapter 158 to transmit the multi-destination packet to the virtual switches in the MDG-1 receiver's list, network adapter 158 performs a head end replication process for the multi-destination packet by creating a replica of the packet for each virtual switch in the MDG-1 receiver's list. For each virtual switch in the MDG-1 receiver's list, network adapter 158 obtains the virtual switch tunneling endpoint information. The tunneling endpoint information may contain the required tunneling protocol for the destination virtual switch and the virtual local area network (VLAN) port group. The VLAN port group is configured during the initial VLAN configuration process by an administrator. The VLAN port group includes physical network interface cards (NICs), VLAN information and teaming policy. These port groups dictate how VLAN traffic is carried in and out of the host TEP through the physical NICs. Network adapter 158 encapsulates the replicated multi-destination packet for the destination virtual switch with tunneling protocol specific headers. In computer networking, encapsulation is a method of designing modular communication protocols in which logically separate functions in the network are abstracted from their underlying structures by inclusion or information hiding within higher level objects. A tunneling protocol allows a network user to access or provide a network service that the underlying network does not support or provide directly. One important use of a tunneling protocol is to allow a foreign protocol to run over a network that does not support that particular protocol, e.g., running IPv6 over IPv4.

Network adapter 158 transmits each encapsulated packet to its destination MDG-1 receivers in the MDG-1 receiver's list. In step 408, network adapter 158 sends a first encapsulated packet to virtual switch 116. In step 410, virtual switch 116 receives and unencapsulates the packet, identifies the multi-destination group "MDG-1" contained in the packet, then looks up the multi-destination group in a port list. In computer networking, to unencapsulate a packet is to remove the previously encapsulated data. A virtual switch serves as a container for port configurations that use a common set of network adapters, including sets that contain no network adapters at all. In one embodiment, the port list may be stored in the virtual switch or on the local server. Each virtual switch provides a finite number of ports through which virtual machines, e.g., VM 152 and VM 154, and network services can reach one or more networks. Virtual switch 116 forwards the packet to destination port "X" on network adapter 118 on server 102 as depicted in step 412.

In step 414, network adapter 158 sends a second encapsulated packet to virtual switch 138. In step 416, virtual switch 138 receives and unencapsulates the packet, and looks up the multi-destination group "MDG-1" in a port list. Virtual switch 138 forwards the packet to destination port "Y" on network adapter 140 on server 124 as depicted in step 418.

Figure 5:
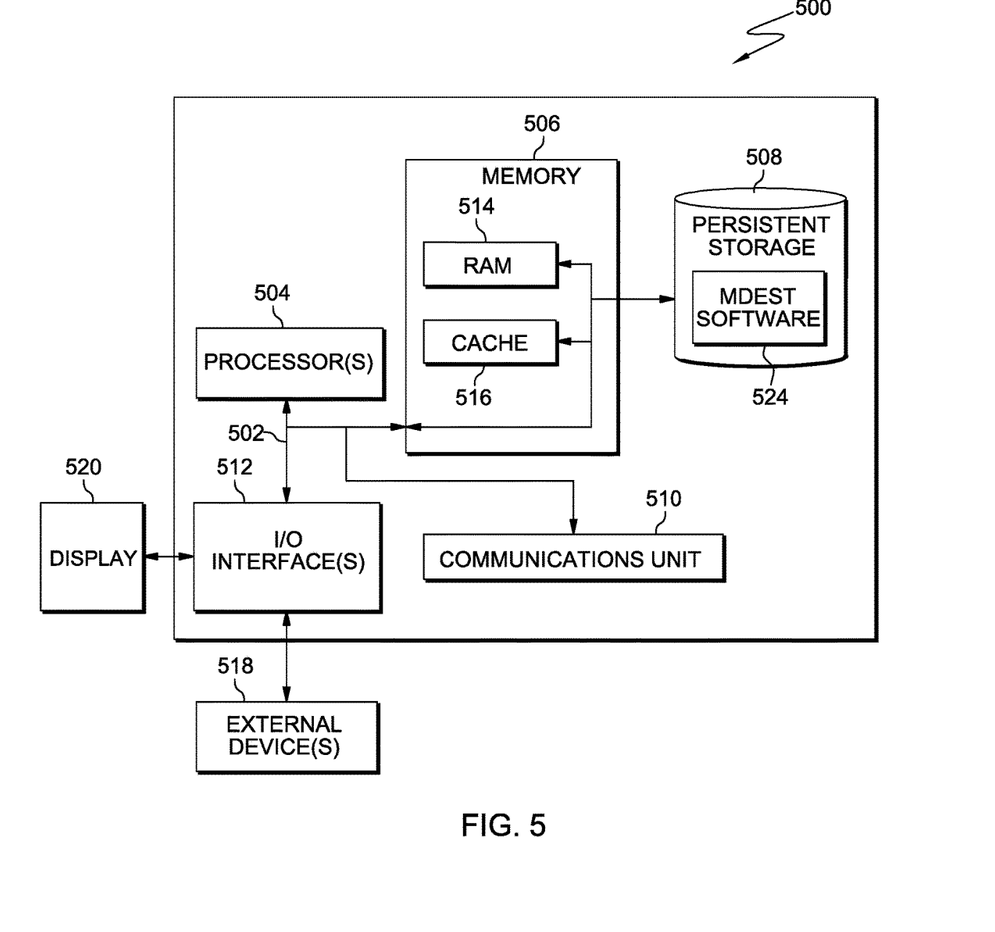
FIG. 5 depicts a block diagram of a server computer, in an embodiment in accordance with the present invention.

FIG. 5 depicts a block diagram of components of a server computer in an embodiment in accordance with the present invention. It should be appreciated that FIG. 5 provides only an illustration of one implementation and does not imply any limitations with regard to the environments in which different embodiments may be implemented. Many modifications to the depicted environment may be made.

A server computer 500 is an embodiment of each of server computers 102, 124, and 142 and includes a communications fabric 502, which provides communications between a computer processor(s) 504, a memory 506, a persistent storage 508, a communications unit 510, and an input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In this embodiment, memory 506 includes random access memory (RAM) 514 and cache memory 516. In general, memory 506 can include any suitable volatile or non-volatile computer readable storage media.

Multi-destination software 524, which is analogous to each of multi-destination software 110, 132, and 150, is stored in persistent storage 508 for execution by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices, including resources of network 120 such as network controller 122. In these examples, communications unit 510 includes one or more network interface cards. Communications unit 510 may provide communications through the use of either or both physical and wireless communications links. Multi-destination software 524 may be downloaded to persistent storage 508 through communications unit 510.

I/O interface(s) 512 allows for input and output of data with other devices that may be connected to server 102. For example, I/O interface 512 may provide a connection to external devices 518 such as a keyboard, keypad, a touch screen, and/or some other suitable input device. External devices 518 can also include portable computer readable storage media such as, for example, thumb drives, portable optical or magnetic disks, and memory cards. Software and data used to practice embodiments of the present invention, e.g., multi-destination software 524, can be stored on such portable computer readable storage media and can be loaded onto persistent storage 508 via I/O interface(s) 512. I/O interface(s) 512 also connect to a display 520. Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
   receiving, by one or more processors of a hardware network adapter, a request, from a first virtual switch of an overlay network, to transmit a multi-destination packet to each of one or more virtual switches of a multi-destination group of the overlay network;
   replicating, by one or more processors of the network adapter, the multi-destination packet for each virtual switch of the multi-destination group;
   obtaining, by one or more processors of the network adapter, tunneling endpoint information for each virtual switch of the multi-destination group;
   encapsulating, by one or more processors of the network adapter, each replicated multi-destination packet with a header specific to a respective tunneling protocol identified in the determined tunneling endpoint information for the respective virtual switch; and
   transmitting, by one or more processors of the network adapter, each encapsulated multi-destination packet to a respective receiver hosted on the encapsulated multi-destination packet's respective virtual switch, wherein the respective virtual switch determines a destination port for the encapsulated multi-destination packet on the respective virtual switch by identifying the multi-destination group, determined from the encapsulated multi-destination packet, in a port list on the respective virtual switch.

2. The method of claim 1, further comprising:
   receiving, by one or more processors on the network adapter, a second request from the first virtual switch;
   unencapsulating, by one or more processors, the second request from the first virtual switch;
   determining, by one or more processors, a multi-destination group operation based, at least in part, on the unencapsulated second request; and
   performing, by one or more processors, the multi-destination group operation.

3. The method of claim 2, wherein:
   the second request from the first virtual switch is a request to add a second virtual switch to the multi-destination group; and
   the determined multi-destination group operation includes storing, by one or more processors on the network adapter, an identifier of the second virtual switch in a multi-destination receivers list identifying the multi-destination group.

4. The method of claim 2, wherein:
   the second request from the first virtual switch is a request to delete a second virtual switch from the multi-destination group; and
   the determined multi-destination group operation includes removing, by one or more processors on the network adapter, a stored identifier of the second virtual switch from a multi-destination receivers list identifying the multi-destination group.

5. The method of claim 1, wherein determining, by one or more processors on the network adapter, tunneling endpoint information for each virtual switch identified in the multi-destination group comprises:

retrieving, by one or more processors on the network adapter, the tunneling endpoint information for each identified virtual switch in the multi-destination group from a network controller.

6. The method of claim 1, wherein the overlay network is a logical network formed and operated using a logical representation of a network, and wherein the network adapter is a hardware component that connects a computer to the network and allows the computer to communicate with other computing devices of the network and the overlay network.

7. The method of claim 1, wherein replicating, by one or more processors of the network adapter, the multi-destination packet for each virtual switch of the multi-destination group comprises performing a head-end replication of the multi-destination packet.

8. A computer program product comprising:
one or more computer readable storage media and program instructions stored on the one or more computer readable storage media, wherein the one or more computer readable storage media are not transitory signals per se, the program instructions comprising:
program instructions to receive, by a hardware network adapter, a request, from a first virtual switch of an overlay network, to transmit a multi-destination packet to each of one or more virtual switches of a multi-destination group of the overlay network;
program instructions to replicate, by the network adapter, the multi-destination packet for each virtual switch of the multi-destination group;
program instructions to obtain, by the network adapter, tunneling endpoint information for each virtual switch of the multi-destination group;
program instructions to encapsulate, by the network adapter, each replicated multi-destination packet with a header specific to a respective tunneling protocol identified in the determined tunneling endpoint information for the respective virtual switch; and
program instructions to transmit, by the network adapter, each encapsulated multi-destination packet to a respective receiver hosted on the encapsulated multi-destination packet's respective virtual switch, wherein the respective virtual switch determines a destination port for the encapsulated multi-destination packet on the respective virtual switch by identifying the multi-destination group, determined from the encapsulated multi-destination packet, in a port list on the respective virtual switch.

9. The computer program product of claim 8, further comprising:
program instructions to receive, by the network adapter, a second request from the first virtual switch;
program instructions to unencapsulate, by the network adapter, the second request from the first virtual switch;
program instructions to determine, by the network adapter, a multi-destination group operation based, at least in part, on the unencapsulated second request; and
program instructions to perform, by the network adapter, the multi-destination group operation.

10. The computer program product of claim 9, wherein:
the second request from the first virtual switch is a request to add a second virtual switch to the multi-destination group; and
the determined multi-destination group operation includes the network adapter storing an identifier of the second virtual switch in a multi-destination receivers list identifying the multi-destination group.

11. The computer program product of claim 9, wherein:
the second request from the first virtual switch is a request to delete a second virtual switch from the multi-destination group; and
the determined multi-destination group operation includes the network adapter removing a stored identifier of the second virtual switch from a multi-destination receivers list identifying the multi-destination group.

12. The computer program product of claim 8, wherein determining tunneling endpoint information for each virtual switch identified in the multi-destination group comprises:
program instructions to retrieve, by the network adapter, the tunneling endpoint information for each identified virtual switch in the multi-destination group from a network controller.

13. The computer program product of claim 8, wherein the overlay network is a logical network formed and operated using a logical representation of a network, and wherein the network adapter is a hardware component that connects a computer to the network and allows the computer to communicate with other computing devices of the network and the overlay network.

14. The computer program product of claim 8, wherein the network adapter replicating the multi-destination packet for each virtual switch of the multi-destination group comprises performing a head-end replication of the multi-destination packet.

15. A network adapter comprising a processor, a memory, and program instructions stored in the memory for execution by the processor to implement a method comprising:
the network adapter receiving a request from a first virtual switch of an overlay network, to transmit a multi-destination packet to each of one or more virtual switches of a multi-destination group of the overlay network;
the network adapter replicating the multi-destination packet for each virtual switch of the multi-destination group;
the network adapter obtaining tunneling endpoint information for each virtual switch of the multi-destination group;
the network adapter encapsulating each replicated multi-destination packet with a header specific to a respective tunneling protocol identified in the determined tunneling endpoint information for the respective virtual switch; and
the network adapter transmitting each encapsulated multi-destination packet to a respective receiver hosted on the encapsulated multi-destination packet's respective virtual switch, wherein the respective virtual switch determines a destination port for the encapsulated multi-destination packet on the respective virtual switch by identifying the multi-destination group, determined from the encapsulated multi-destination packet, in a port list on the respective virtual switch.

16. The network adapter of claim 15, further comprising:
the network adapter receiving a second request from the first virtual switch;
the network adapter unencapsulating the second request from the first virtual switch;
the network adapter determining a multi-destination group operation based, at least in part, on the unencapsulated second request; and
the network adapter performing the multi-destination group operation.

17. The network adapter of claim 16, wherein:
the second request from the first virtual switch is a request to add a second virtual switch to the multi-destination group; and
the determined multi-destination group operation includes the network adapter storing an identifier of the second virtual switch in a multi-destination receivers list identifying the multi-destination group.

18. The network adapter of claim 16, wherein:
the second request from the first virtual switch is a request to delete a second virtual switch from the multi-destination group; and
the determined multi-destination group operation includes the network adapter removing a stored identifier of the second virtual switch from a multi-destination receivers list identifying the multi-destination group.

19. The network adapter of claim 15, wherein determining tunneling endpoint information for each virtual switch identified in the multi-destination group comprises:
the network adapter retrieving the tunneling endpoint information for each identified virtual switch in the multi-destination group from a network controller.

20. The network adapter of claim 15, wherein the overlay network is a logical network formed and operated using a logical representation of a network, and wherein the network adapter is a hardware component that connects a computer to the network and allows the computer to communicate with other computing devices of the network and the overlay network.

* * * * *